United States Patent [19]

Kunz

[11] Patent Number: 4,644,277

[45] Date of Patent: Feb. 17, 1987

[54] NMR TOMOGRAPHY APPARATUS

[75] Inventor: Dietmar Kunz, Hamburg, Fed. Rep. of Germany

[73] Assignee: U.S. Philips Corporation, New York, N.Y.

[21] Appl. No.: 689,543

[22] Filed: Jan. 7, 1985

[30] Foreign Application Priority Data

Jan. 12, 1984 [DE] Fed. Rep. of Germany ....... 3400861

[51] Int. Cl.$^4$ ............................................. G01R 33/20
[52] U.S. Cl. .................................... 324/309; 324/307
[58] Field of Search ............... 324/300, 307, 309, 312, 324/311, 318, 319, 322

[56] References Cited

U.S. PATENT DOCUMENTS 4,480,228 10/1984 Bottomley ........................... 324/309

Primary Examiner—Michael J. Tokar
Attorney, Agent, or Firm—Robert T. Mayer; Algy Tamoshunas

[57] ABSTRACT

The invention relates to an NMR tomography apparatus which, in addition to coil systems for generating a magnetic field which varies linearly in space, bar at least one further coil system for generating a magnetic field which varies non-linearly in space so that a locally non-constant gradient of the magnetic field is obtained. The variation of the spatial resolution is thus the same as that of the gradient of the magnetic field.

6 Claims, 6 Drawing Figures a)

b)

a)

b)

NMR TOMOGRAPHY APPARATUS

The invention relates to an NMR (nuclear magnetic resonance) tomography apparatus comprising an arrangement for generating a homogeneous steady magnetic field and three coil systems wherethrough currents flow which vary in time. The coil systems serve to generate additional magnetic fields which extend in the direction of the steady magnetic field and which vary linearly in space in three mutually perpendicular directions. Such an apparatus also includes an RF coil for generating an RF magnetic field perpendicularly to the direction of the steady field.

Figure 1:
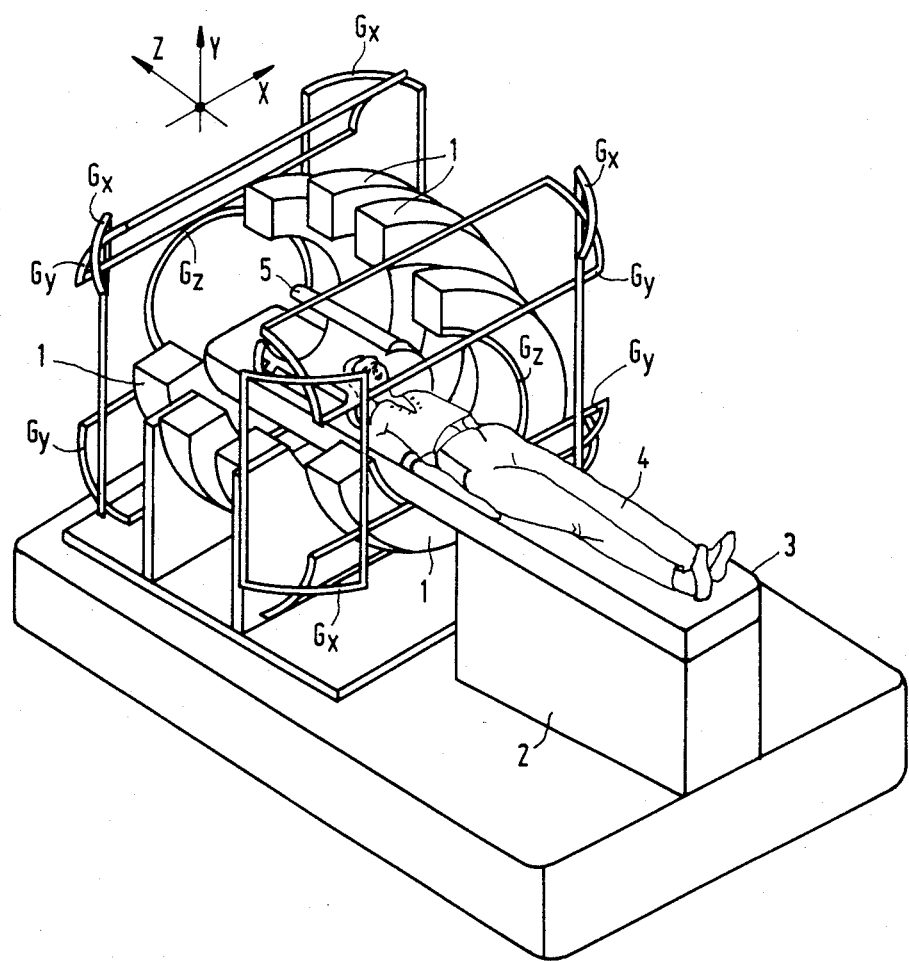

Such an NMR tomography apparatus is known, for example from German Offenlegungschrift No. 28-49 355 and is shown in a partly broken-away view in FIG. 1. The NMR tomography apparatus comprises an arrangement for generating a strong, homogeneous, main steady magnetic field which extends in the z-direction of an xyz system of coordinates. This arrangement consists of four concentric annular coils 1 whose central axis extends in the z-direction. Inside these coils the magnetic field is homogeneous in a comparatively large zone—the examination zone—and has a flux density of between 0.1 T and 2 T; the higher flux densities must usually be obtained by means of a superconducting coil system. A patient 4 to be examined is introduced into the examination zone on a patient table 2 with a top 3 which is displaceable in the z-direction.

The NMR tomography apparatus furthermore comprises three coil systems for generating gradient magnetic fields which extend in the z-direction and which vary linearly in space in the x, the y and the z-direction. These coil systems are generally referred to as "gradient coils". The coil system for generating a magnetic field which extends and linearly decreases in the z-direction consists of at least two similar coils Gz which are arranged so as to be staggered with respect to one another in the z-direction and symmetrical with respect to the coils 1. Between the coils Gz, a magnetic field is generated which extends in the z-direction and which varies linearly as a function of the location in this direction when a current flows through the coils in opposite directions.

The coil system for generating another magnetic field which also extends in the z-direction but which varies linearly in space in the x-direction consists of the four similar coils Gx. These approximately rectangular coils are arranged on the circumference of a circular cylinder whose center line extends parallel to the y-axis and passes through the center of the rings 1 and, hence, the examination zone. Currents of the same value flow through the four coils Gx, said currents being directed so that in neighbouring coils the respective parts which face the other coil and which extend in the y-direction conduct current in the same direction.

The coil system for generating a magnetic field which extends in the z-direction and which varies linearly in the y-direction as a function of the location has a construction which is identical to that of the coil system Gx, except that it has been rotated through 90°. This means that this coil system also consists of four rectangular coils which are arranged on the circumference of a circular cylinder. The central axis of this circular cylinder, however, extends parallel to the x-axis through the centers of the examination zone. The magnetic field produced by the coil systems Gx and Gy has the flux density zero in the symmetry axis extending in the z-direction.

Finally there is provided an RF coil 5 which generates a homogeneous RF field in the examination zone, the frequency of this field corresponding to the Larmor frequency of the precessional motion of the nuclear spins about the z-axis in the examination zone.

Such an NMR tomography apparatus in principle has a large number of imaging capabilities. For example, in the examination zone nuclear spins can be excited in a volume of the body to be examined, thus allowing for a reconstruction of the nuclear spin distribution in this volume when the three coil systems Gx, Gy, Gz are suitably energized. However, such three-dimensional imaging methods are very time consuming and, therefore, have not been successful in practice.

Use is more frequently made of two-dimensional imaging methods where the nuclear spins are excited only in a slice of the object to be examined. To this end, during the excitation of the nuclear spins by the RF coil 5, the coils Gz are energized by a current so that the magnetic field generated by the coils 1 and Gz varies linearly from one coil Gz to another. Consequently, the nuclear spins are excited in the slice whose Larmor frequency (as is known, the Larmor frequency is proportional to the magnetic field strength) corresponds to the frequency of the RF field. Subsequently, the coils Gx and Gy are simultaneously or successively energized, so that the magnetic field in the layer changes in the x-direction or the y-direction, respectively. The phase and the amplitude of resonance signal induced in the coil 5 after the excitation are influenced so that the nuclear spin distribution in the excited slice can be reconstructed.

FIG. 2a shows the variation in space of the magnetic field strength in the x-y plane. The horizontal straight lines represent the field of the coils Gy, the magnetic field strength changing each time by the same amount between arbitrary pairs of neighbouring lines. The same is applicable to the vertical straight lines which represent the field generated by the coils Gx and which each time interconnect the locations of the same magnetic field strength of these coils. It will be apparent that for both coils the spatial distance between two neighbouring lines, each representing the same magnetic field strength and, between which a given difference in field strength exists, is constant for each pair of lines in each direction. This is due to the fact that the field generated by the coils Gx and Gy varies linearly in space in the x-direction and the y-direction, respectively, i.e. has a constant gradient in these directions. If an object exhibiting a checkerboard-like nuclear spin distribution in an x-y plane were examined by means of such fields, the signals induced into the RF coil during the examination would result in a checkerboard-like reconstruction of a nuclear spin density distribution as shown in FIG. 2b. In practice, however, the image would deviate from the actual density distribution because of the limited spatial resolution of such an NMR tomography apparatus.

Improvement of the resolution would require inter alia increased measurement periods which are already comparatively long or an increased magnetic field gradient which would cause an increased bandwidth of the signal received, so that the signal-to-noise ratio would deteriorate.

The object of the present invention is to construct an NMR tomography apparatus of the kind set forth above with improved resolution in a part of the examination zone.

This object is achieved in accordance with the invention in that there is provided at least one further coil system for generating a magnetic field which also extends in the direction of the main field and which varies non-linearly in space, and in that the further coil system can be connected to a current source which supplies a current i which satisfies the condition $$i = ai1 + bi1 + ci3,$$

wherein a, b, c are constants and i1, i2, i3 are the currents through the three coil systems.

As opposed to the NMR tomography apparatus known thus far in which it is attempted to construct the coil systems so that an as constant as possible gradient of the magnetic field is obtained or a field is obtained which varies as linearly as possible in space, the invention uses an approach involving (at least) one coil system whose magnetic field varies non-linearly in space, so that its magnetic field gradient depends on the position in space. While the resolution is spatially constant in known NMR tomography apparatus, the resolution in accordance with the invention varies in accordance with the gradient of the magnetic field, i.e. in a zone in which the gradient of the magnetic field is large, the resolution is high and in a zone in which the gradient of the magnetic field is small, the resolution is low.

From J. Phys. E. Sci. Instrum., Vol. 16, 1983, pp. 34 to 38, and from Phys. Med. Biol., 1983, Vol. 28, No. 8, pp. 925 to 938 it is known that during reconstruction, faults can occur when the gradient of the magnetic field is not constant across the entire examination zone. Such undesirable inhomogeneities occur in gradient coils having a compact construction in which the gradient is larger at the edges of the examination zone than in the centre thereof. These publications also state that the resultant reconstruction errors can be eliminated by means of a suitable reconstruction algorithm if the gradient is exactly known for each point of the examination zone. In accordance with the invention, however, the non-linearity is deliberately increased by the use of at least one further coil system in order to achieve an improved resolution in a given zone.

The degree of spatial variation of the gradient of the magnetic field can be separately determined for each examination by way of the constants a, b and c. For example, when all three constants are zero, the magnetic field generated by the further coil system will also be zero so that the imaging is determined only by the constant-gradient magnetic fields generated by the three coil systems. The extreme opposite situation occurs when the current i1, i2 or i3 flows through the further coil system instead of the associated coil system with spatially constant gradient. Thus, in this situation one of the coefficients a, b or c would be infinitely large or very large.

In a preferred embodiment of the invention there are provided at least two coil systems for generating magnetic fields which are parallel to the steady magnetic field and which vary non-linearly in space in the same direction but to a different extent, the currents through these coils exhibiting the same variation in time but an adjustable amplitude. By variation of the amplitude by the various coil systems the spatial position of, for example, the maximum value of the magnetic field gradient can thus be adapted to satisfy given requirements. This means that the position of the part of the examination zone in which the resolution is particularly high can be varied in accordance with the relevant requirements. This version of the invention (like the invention itself) can in principle be used for three-dimensional imaging methods, but notably also for two-dimensional imaging methods.

Figure 2:
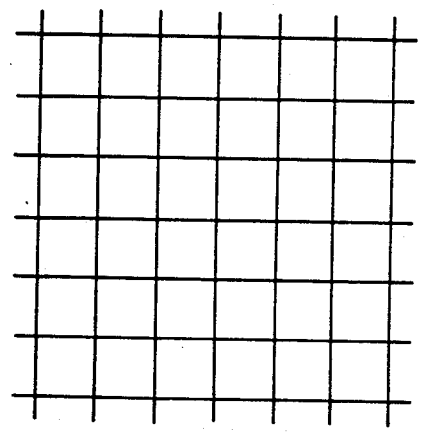
Figure 2:
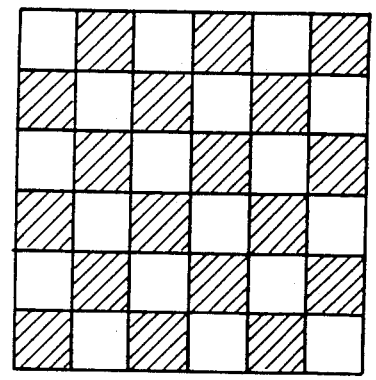
Figure 3:
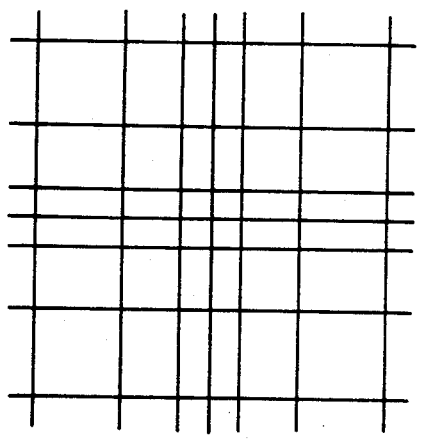
Figure 3:
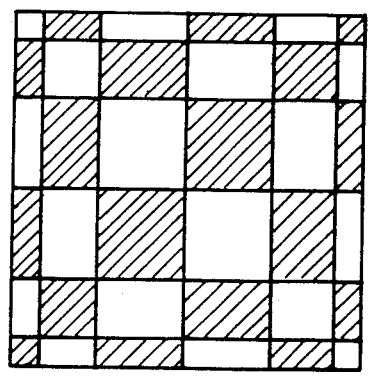
Figure 4:
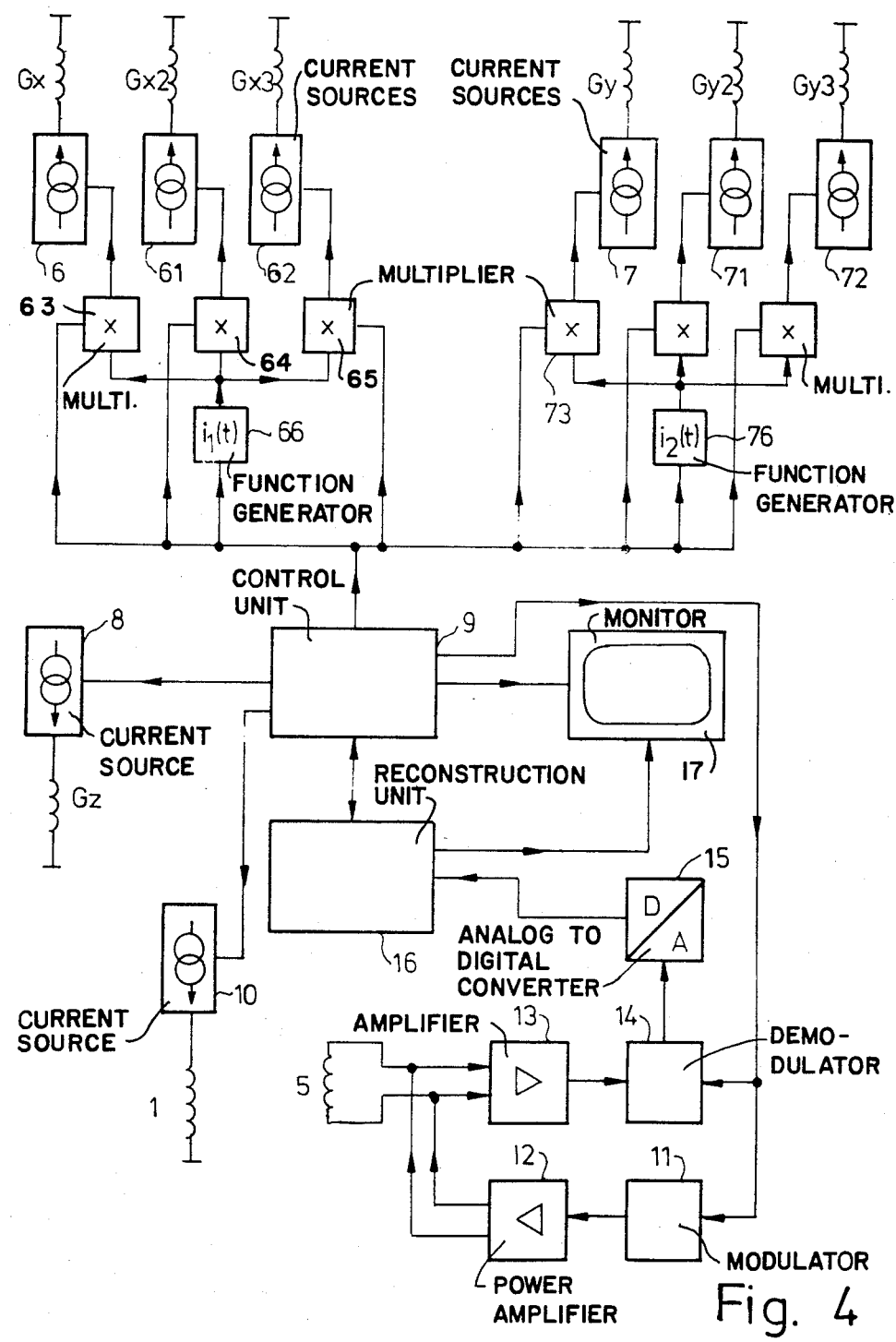

The invention will be described in detail hereinafter with reference to the accompanying diagrammatic drawing. Therein:

FIG. 1 is a perspective view of a known NMR tomography apparatus,

FIG. 2a shows the variation in space of the magnetic field strength in an x-y plane, and FIG. 2b shows the nuclear spin distribution reconstructed by means of such an arrangement, FIG. 3a shows the variation in space of the magnetic field strength in accordance with the invention, FIG. 3b shows the reconstruction of a checkerboard-like nuclear spin density distribution by means of an NMR tomography apparatus in accordance with the invention, and FIG. 4 shows a block diagram of an NMR tomography apparatus in accordance with the invention.

The current for the coil systems Gx, Gy, Gz is supplied by current sources 6, 7 and 8 which are controlled by a central control unit 9 (FIG. 4). This unit also controls a current source arrangement 10 for generating direct currents for the coils 1 which generate the steady magnetic field extending in the z-direction. A modulator 11 produces a carrier oscillation which is applied to the RF coil 5 via a power amplifier 12. The frequency of the modulated oscillation, as well as the intensity of the magnetic field generated by the coils 1, are adapted to one another so that nuclear spin resonance is excited in a slice of the body 4 to be examined. The signals induced in the coil 5 after this excitation are applied to a phase-sensitive demodulator 14 via an amplifier 13. The output signal of the demodulator is converted into a digital data word by a analog/digital converter 15 in order to be applied to a reconstruction unit 16. On the basis of the data received, this unit determines the spatial distribution of the nuclear spins in the excited slice by means of a predetermined algorithm, said distribution being displayed, for example by means of a monitor 17.

The arrangement described thus far is known.

In accordance with the invention, however, there are provided four additional coil systems Gx2, Gx3, Gy2 and Gy3 which are connected to controllable current sources 61, 62, 71 and 72, respectively. The coils Gx2 and Gy2 generate a magnetic field which is directed parallel to the z-axis and whose intensity varies as a square-law function of the location in the x-direction and the y-direction, respectively, the magnetic field strength being zero in the symmetry axis parallel to the z-axis. The coils Gx3 and Gy3 generate a magnetic field which extends in the z-direction and whose intensity varies as a third power of the location in the x-direction and the y-direction respectively.

Coils for generating magnetic fields which extend in the z-direction and whose field strength varies non-linearly as a function of the location in either the x-direction or the y-direction are known in NMR tomography apparatus. They are used as correction coils (shim coils) for eliminating inhomogeneities in the steady magnetic field. Such coil systems are described in "The Review of Scientific Instruments", Vol. 23, No. 3, March 1961, pp. 241 to 250, in U.S. Pat. No. 3,582,779 and in DE-OS No. 19 46 059. The fact that the field in such coil systems can change not only in one of the two directions (x or y) but also in the z-direction, is not objectionable in NMR tomography apparatus in which a slice is examined which is situated in the x-y plane, because for this slice z is constant.

The current source 6, 61 and 62 are controlled by the central control unit 9 so that the current through the coils Gx, Gx2 and Gx3 exhibits the same variation in time, but a different (adjustable) amplitude.

This can be achieved by means of three multiplier stages 63, 64, 65 whose outputs are connected to the control inputs of the current sources 6, 61 and 62, respectively, and in which the signal of a function generator 66 is multiplied by factors which are produced by the control unit and which represent the weight with which the field of the relevant coil Gx, Gx2 or Gx3 becomes effective. As has already been stated, all coil systems Gx, Gx2 and Gx3 thus carry currents which exhibit the same variation but whose amplitude can be adjusted by the central control unit 9.

Similarly, the control inputs of the coil systems Gy, Gy2, Gy3 are connected to outputs of multiplier stages 73, 74 and 75 in which the output signal of a function generator 76 which determines the variation in time of all three currents is multiplied by the weighting factors determined by the central control unit 9, so that the currents through these coils again exhibit the same variation in time but a different amplitude.

When the factors for the multiplier stages 64, 65, as well as 74 and 75, are chosen so that the currents of the current sources 61, 62, as well as 71 and 72, become zero, there will be no difference with respect to the NMR tomography apparatus already described with reference to FIG. 1. The magnetic fields generated by the gradient coil systems Gx, Gy notably exhibit the field strength variation shown in FIG. 2 and a checkerboard-like nuclear spin distribution in the object examined will be displayed as shown in FIG. 2b.

However, when the currents produced by the current sources 61, 62 or 71, 72 deviate from zero, a different situation arises. The magnetic field strength then no longer varies linearly in the x-y plane and FIG. 3a is then applicable; therein, the locations of the same magnetic field strength in an x-y plane are again interconnected by a line (straight line) and two arbitrary neighbouring lines each time correspond to a given field strength difference (assuming that the currents through the coils Gy, Gy2 and Gy3 are switched off when the currents flow through the coils Gx, Gx2 and Gx3 and vice versa). It can be seen that the spatial distance between two neighbouring lines is large on the outside and small on the inside in the x-direction as well as in the y-direction, i.e. the maximum value of the gradient of the magnetic field strength is situated in the centre. When an object having a checkerboard-like distribution of the nuclear spin density is examined by means of magnetic fields which are variable in the x-direction and the y-direction as shown in FIG. 3a, and when the nuclear spin density distribution in the plane examined is reconstructed in the usual manner from the signals induced in the coil 5, the distribution shown in FIG. 3b will be obtained. A comparison with FIG. 2b reveals that the structure in the centre is shown in enlarged form and the structure at the edge in reduced form.

A similar representation would be obtained when a checkerboard were imaged by means of a fish-eye objective. It can also be demonstrated that, to the same extent as in the image, as the size of the inner zones increases and the size of the outer zones decreases, the information concerning these zones and derived from the signals induced in the coil 5 also increases and decreases, respectively. A comparatively large amount of information is thus obtained as regards the central zones at the expense of the outer zones for which a comparatively small amount of information is obtained (in comparison with the reconstruction shown in FIG. 2b in which the information obtained is the same for all zones). This means that the resolution at the center has been improved at the expense of the resolution at the edges.

The geometrical distortion of the reconstructed nuclear spin density distributions in FIG. 3b with respect to the actual distribution can be eliminated, if desired, by modification of the reconstruction algorithm. Because the amplitude of the currents through the coil systems Gx2 and Gx3 or Gy2 and Gy3 is known, the extent of the geometrical distortion is also fixed, so that the reconstruction algorithm can be changed to eliminate this distortion. Instead of the reconstruction shown in FIG. 3b, a reconstruction would then be obtained which would again correspond to a checkerboard-like distribution. Contrary to FIG. 2b, the information density, i.e. the spatial resolution, in the centre, however, would then be higher than at the edge, i.e. details present in the centre would be imaged more clearly than those at the edge.

It has been assumed in the foregoing that the gradient of magnetic field strength is largest in the centre (x=0, y=0), so that the resolution is also highest in the centre. This holds good only for a given combination of the currents through the coil systems Gx, Gx2 and Gx3 or Gy, Gy2 and Gy3. For any other combination the position of the maximum gradient changes in the x-direction and the y-direction. Because these combinations are determined by the control unit 9, they can be used to adapt the position of the maximum values of the gradient, or the zone having the highest resolution, to the relevant requirements.

In special cases, the current through the coil systems Gx and Gy can be made equal to zero while the current through at least one of the coil systems Gx2 and Gx3 or Gy2 and Gy3 deviates from zero. In that case the gradient field in the x-direction and the y-direction would vary only non-linearly.

Instead of coil systems in which the magnetic field strength in the x-direction or the y-direction varies as a square-law or cubic function, use can alternatively be made of coil systems in which the magnetic field strength varies non-linearly as a function of the location in another manner. The position of the maximum gradient values could then also be changed by changing the combination of currents applied to these coil systems. Moreover, it is also possible to use one or more coil systems which generate a magnetic field which extends in the z-direction and which varies non-linearly in the x-direction and the y-direction.

In the arrangement shown in FIG. 4, a current flows through the coils Gx2 and Gx3 which depends only on the current flowing through the coil Gx, while a current flows through the coils Gy2 and Gy3 which exhibits the same variation in time as the current through the coil Gy but which is independent of the current through the coil Gx. It is in principle also possible to form the current through each of the coils Gx2, Gx3, Gy2 and Gy3 from a linear combination of the current i1 through the coil Gx and the current i2 through the coil Gy, so that $$i = ai1 + bi2$$

in the two-dimensional case, and $$i = ai1 + bi2 + ci3$$

in the three-dimensional case, wherein i3 is the current through the coil Gz. A different set of coefficients a, b, c may then be applicable to each of the coils. However, the interpretation of the distorted image (FIG. 3b) or the later improvement thereof is facilitated when the currents through the coils with a spatially non-linearly varying magnetic field (for example, through Gx2, Gx3) exhibit the same variation in time as the current through the coil (Gx) whose magnetic field strength varies in the same direction, be it linearly, in space.

What is claimed is:

1. An NMR tomography apparatus comprising means for generating a homogeneous, steady, main magnetic field in an examination space, three gradient coil systems, first means for supplying a time varying current to each of said gradient coil system so that said gradient coil systems generate, in the examination space, additional magnetic fields which extend in the direction of the main, steady magnetic field and which vary linearly in space in three mutually perpendicular directions, means for generating, in the examination space, an RF magnetic field perpendicularly to the direction of the steady, main field, at least one further coil system for generating, in the examination space, a further magnetic field which also extends in the direction of the main field and which varies non-linearly in space, and second means for supplying to the further coil system a current, i, which satisfies the condition:

$$i = ai1 + bi2 + ci3$$

wherein a, b and c are constants and i1, i2, i3 are the currents supplied to the three gradient coil systems.

2. An NMR tomography apparatus as claimed in claim 1, in which a current flows through at least one of the three gradient coil systems during excitation of nuclear spins by the RF magnetic field generating means in a slice of an object disposed in the examination space, and wherein the further magnetic field generated by the further coil system varies parallel to the slice and non-linearly in space in the slice.

3. An NMR tomography apparatus as claimed in claim 2 in which the slice is determined by the switching on of the current through only one gradient coil system of the three gradient coil systems during the excitation of the nuclear spins and wherein the current supplied to the further coil system corresponds to the weighted sum of the currents supplied to the other two gradient coil systems.

4. An NMR tomography apparatus as claimed in claim 2 or 3, comprising at least two of said further coil systems for generating said further magnetic fields which extend parallel to the steady, main magnetic field and which vary non-linearly in space in the same direction but not to the same extent, and wherein said second means supplies, to said further coil systems, currents which have the same variation in time but an adjustable amplitude.

5. An NMR tomography apparatus as claimed in claim 4, wherein the first means supplies, to the gradient coil system which is not energised during the excitation of the RF magnetic field and whose magnetic field varies linearly in space in the same direction as that in which the further magnetic fields of the two further coil systems vary non-linearly in space, a current having the same variation in time as the currents supplied by the second means to the two further coil systems.

6. In an NMR apparatus for producing an image of a region of an object disposed in an examination zone, said apparatus having means for producing, in said examination zone, a homogeneous main magnetic field, means for generating, in said examination zone, gradient magnetic fields which vary linearly in space in three mutually perpendicular directions and means for generating, in said examination zone, an RF field so as to excite nuclear spins in said region of said object, the improvement comprising means for generating, in said examination zone, a further magnetic field which varies non-linearly in space so as to maximize the value of the gradient of the magnetic field strength at a position in said examination zone corresponding to a desired location in said region of the object to be examined so as to increase spatial resolution of that portion of the image which corresponds to said desired location of said region of the object.

* * * * *